United States Patent [19]

Gillespie

[11] 4,194,163
[45] Mar. 18, 1980

[54] FLOATING POINT AMPLIFIER MEANS AND METHOD

[75] Inventor: Ronald G. Gillespie, Old Tappan, N.J.

[73] Assignee: Texaco Development Corporation, White Plains, N.Y.

[21] Appl. No.: 930,634

[22] Filed: Aug. 3, 1978

[51] Int. Cl.² ............................................. H03G 3/20
[52] U.S. Cl. .................................... 330/86; 330/279; 367/66
[58] Field of Search ................. 330/86, 144, 145, 279, 330/282, 284; 340/15.5 GC

[56] References Cited

U.S. PATENT DOCUMENTS

| | | | |
|---|---|---|---|
| 3,308,392 | 3/1967 | McCarter | 330/144 |
| 3,376,557 | 4/1968 | Godinez | 340/15.5 GC |
| 3,464,022 | 8/1969 | Locheed et al. | 330/144 |
| 3,470,487 | 9/1969 | Lucas et al. | 330/86 |
| 3,525,948 | 8/1970 | Sheren et al. | 330/86 X |
| 3,919,685 | 11/1975 | Haill | 340/15.5 GC |
| 3,947,806 | 3/1976 | Corkhill et al. | 330/86 X |
| 3,969,683 | 7/1976 | Fabricius | 330/144 |
| 4,016,557 | 5/1977 | Fitelli et al. | 330/86 X |
| 4,031,504 | 6/1977 | Mioduski | 330/86 X |
| 4,091,380 | 5/1978 | Yu | 330/86 Y |

OTHER PUBLICATIONS

Tobey, "Vary Op-Amp Gain by 2048:1 in Steps of 2:1," *Electronic Design* 24, Nov. 22, 1970, p. 60.
McKeon, "Amplifier Gain Selection with Noise Tolerance" *IBM Technical Disclosure Bulletin,* V. 10, No. 5, Oct., 1967, p. 563.

*Primary Examiner*—James B. Mullins
*Attorney, Agent, or Firm*—Robert A. Kulason; Carl G. Ries; Ronald G. Gillespie

[57] ABSTRACT

A wide dynamic range automatic high speed gain ranging amplifier system includes a receiver circuit adapted to receive an analog input signal. A single stage amplifier is connected to the receiver circuit which amplifies a received analog signal to provide an output signal. A control circuit connected to the receiver circuit and to the amplifier controls the gain of the amplifier in accordance with the output signal and provides digital gain signals corresponding thereto.

6 Claims, 2 Drawing Figures

FLOATING POINT AMPLIFIER MEANS AND METHOD

BACKGROUND OF THE INVENTION

Field of the Invention

The present invention relates generally to multi-channel amplifier systems which are suitable for translating wide dynamic range signals, and, more particularly, to multi-channel gain ranging amplifier system capable of handling wide dynamic range signals, such as those encountered in seismic data processing and, therefore, is particurly suitable for use in digital seismic recording systems.

SUMMARY OF THE INVENTION

A wide dynamic range automatic high speed gain ranging amplifier system includes a receiver circuit adapted to receive an analog input signal. A single stage amplifier is connected to the receiver circuit which amplifies a received analog signal to provide an output signal. A control circuit connected to the receiver circuit and to the amplifier controls the gain of the amplifier in accordance with the output signal and provides digital gain signals corresponding thereto. An analog-to-digital converter connected to the amplifier converts the output signal to digital signals.

The objects and advantages of the invention will appear more fully hereafter from a consideration of the detailed description which follows, taken together with the accompanying drawings, wherein one embodiment of the invention is illustrated by way of example. It is to be expressly understood, however, that the drawings are for illustration purposes only, and are not to be construed as defining the limits of the invention.

DESCRIPTION OF THE INVENTION

Figure 1:
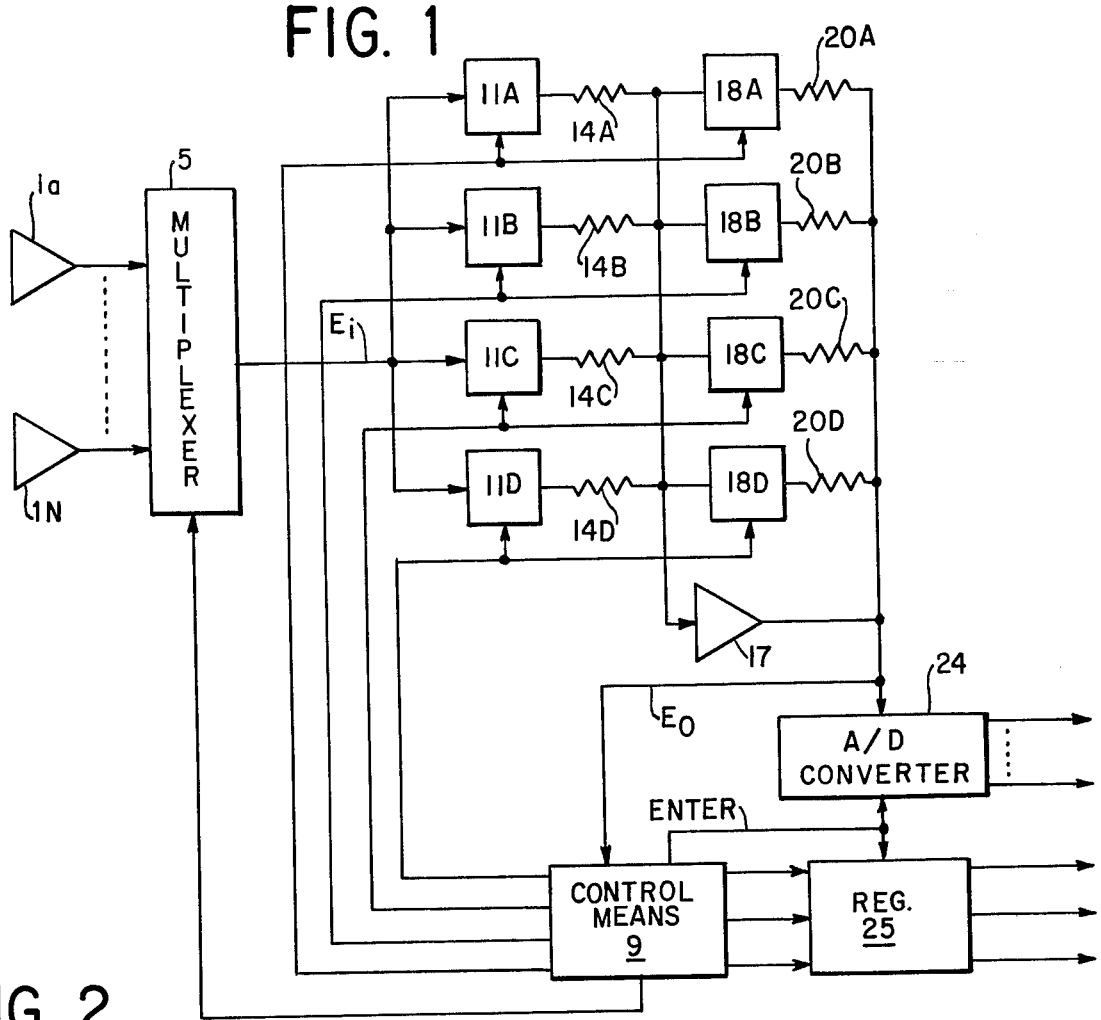
FIG. 1 is a simplified block diagram of a seismic amplifier system constructed in accordance with the present invention.

Referring to FIG. 1, there is shown a seismic signal processing system in which conventional type geophones 1A through 1N detect vibrations in an earth formation and provide signals to a multiplexer 5. Multiplexer 5 is controlled by control means 9 to sequentially multiplex the signals provided by the geophones 1A through 1N to provide an analog signal $E_i$.

Signal $E_i$ is applied to electronic switches 11A, 11B, 11C and 11D which, in turn, are connected to input resistors 14A through 14D. Resistors 14A through 14D have a common connection to an input of an operational amplifier 17. Switches 18A through 18D are also connected to the common connection and to corresponding feedback resistors 20A through 20D. Feedback resistors 20A through 20D have a common connection to the output of amplifier 17. It should be noted that variable resistors may be used for the feedback and the input resistors which would allow them to be trimmed to the desired gain ratio.

Control means 9 provides signals which control pairs of switches such that one signal would render switches 11A and 18B conductive. Similarly, switches 11C and 18D would be rendered conductive simultaneously and switches 11D and 18D would be rendered conductive together so that in effect the signals from control means 9 select a feedback resistor and an input resistor which yields the proper gain as hereinafter explained. Each combination of input resistor and feedback resistor may be thought of as a gain stage.

The gain is related to the floating point digital word which is expressed as a mantissa and an exponent and is in the form:

$$Q = \pm x \, b^{-k} \quad (1)$$

wherein Q represents the absolute magnitude of signal $E_i$, b represents a predetermined gain standard; where x, the mantissa, represents the magnitude of the output signal $E_o$ from amplifier 17, and k, the exponent, represents the number of gain stages and ranges from 1 through n in unit steps and where n is the maximum number of feedback resistors or input resistors. In a preferred embodiment, the standard gain has been selected as eight. Hence, equation 1 may be rewritten as:

$$Q = \pm x \, 8^{-k}. \quad (2)$$

Thus, the gain of amplifier 17 for different switching conditions would be $8^1$, $8^2$, $8^3$ and $8^4$ and the input and feedback resistors selected accordingly.

Amplifier 17 provides output signal $E_o$ to control means 9 and to an analog-to-dogital converter 24. Control means 9 provides an 'enter' pulse to converter 24 and to a register 25 at an appropriate time. Converter 24 provides digital signals to register 25 corresponding to $E_o$. Register 25 provides digital signals corresponding to the mantissa, which is representative of the magnitude of signal $E_i$, and to the sign of signal $E_i$. Control means 9 also provides signals corresponding to the gain switching stage selected or k.

Figure 2:
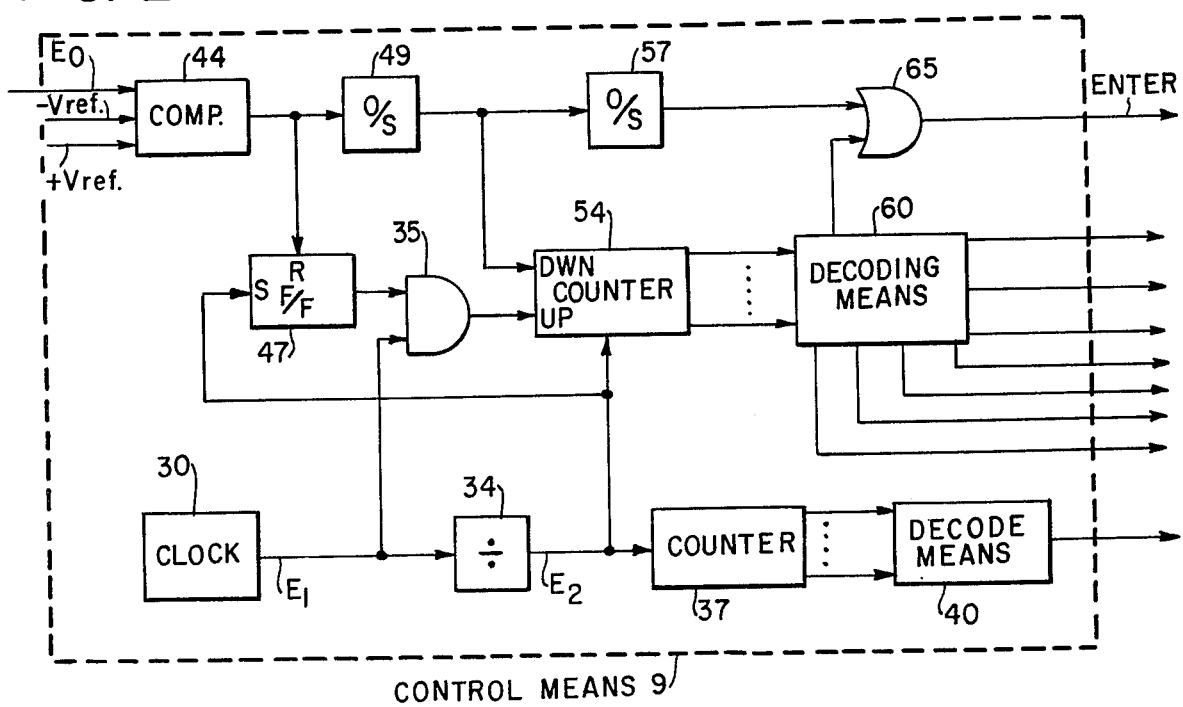
FIG. 2 is a detailed block diagram of the control means shown in FIG. 1.

Referring now to FIG. 2, a clock 30 provides clock pulses $E_1$ to a divider 34 and to an AND gate 35. Divider 34 substantially reduces the repetition rate of the pulses $E_1$ to provide pulses $E_2$ to a counter 37. Counter 37 provides digital signals to decode means 40 corresponding to the count in counter 37. Decode means 40 provides a multiplexing signal to multiplexer 5 causing it to multiplex the signals from geophones 1A through 1N.

Signal $E_o$ is applied to comparator means 44 receiving reference voltages $\pm V_{ref}$ corresponding to the full scale capabilities of converter 24. As long as signal $E_o$ is not more positive than $+V_{ref}$ and not more negative that $-V_{ref}$, comparator 14 provides a high logic level output. However, when signal $E_o$ exceeds either voltage $+V_{ref}$ or $-V_{ref}$, comparator 44 output changes to a low logic level and triggers a flip-flop 47 and a one-shot multivibrator 49.

Flip-flop 47 receives pulses $E_2$ from divider 34 to set it at the start of each multiplex cycle. While in a set state, flip-flop 47 provides a high logic level output to an AND gate 35 causing AND gate 35 to pass clock pulses $E_1$ to an up input of a bi-directional counter 54. The change to the low logic level of the output from comparator 44 resets flip-flop 47 causing it to disable AND gate 35 to block further upcounting by counter 54. One-shot 49, in response to the change in the level of the output from comparator 44, provides a pulse to the down input of counter 54, causing it to count down one count, and to the input of another one-shot multivibrator 57. By counting down one count, the gain of amplifier 17 is changed back to the previous gain which was acceptable. While counter 54 was counting in the up direction decoder means 60 decoded the signals from counter 54 to provide signals corresponding to the gain to register 25 and to provide the control signals to the switches 11A through 11D and 18A through 18D.

Thus, should signal $E_o$ exceed either voltage $+V_{ref}$ or $-V_{ref}$, the chain of events is such that the count in counter 54 is returned to the next previous count, i.e. the gain that was not excessive. The triggering of one-shot 57 causes one-shot 57 to provide a pulse which passes through an OR gate 65 to be provided as the 'enter' pulse to converter 24 and register 25. In this situation the pulse provided by one-shot 49 also has acted as a time delay, allowing the count in counter 54 to be returned to the next previous count.

Should signal $E_o$ not exceed voltage $V_{ref}$, decode means 60, upon counter 54 receiving pulses corresponding in number to the switching stages, provides a pulse output which passes through OR gate 65 to be provided as the 'enter' pulse.

Of course, it would be obvious to one skilled in the art, that the system may be operated by starting at a maximum gain and decreasing the gain until an acceptable gain is reached.

The present invention as hereinbefore described is a seismic signal processing and recording system utilizing a signal stage amplifier.

What is claimed is:

1. A wide dynamic range automatic gain ranging amplifier system comprising means for receiving an analog input signal, a single stage amplifier having an input connected to the receiving means for amplifying a received analog signal to provide an output signal, control means connected to the receiving means and to the amplifier for controlling the gain of the amplifier in accordance with the output signal and providing digital gain signals corresponding thereto, and analog-to-digital converter means connected to the amplifier for providing digital signals corresponding to the output signal, in which the digital signals provided by the control means and the converter means comprise a floating point word including a mantissa and an exponent in the form:

$$Q = \pm x\, b^{-k};$$

where Q represents the magnitude of the input signal to said system; wherein b represents a predetermined gain standard wherein x, the mantissa is represented by the digital signals from the converter means and corresponds to the amplitude of the output signal; and wherein k, the exponent, is represented by the digital signals from the control means and corresponds to the number of gain stages and ranges from 1 through n in unit steps; and the receiving means includes a plurality of n input resistor networks having a first common connection adapted to receive the analog input and a second common connection to the input of the amplifier; and the control means includes a plurality of n feedback resistor networks connected between the input and the output of the amplifier, and control means connected to the output of the amplifier and to the pluralities of input and feedback resistor networks for providing a plurality of control signals in accordance with the output signal so as to control the gain of the amplifier; each control signal is provided to corresponding input and feedback resistor networks.

2. A system as described in claim 1 in which each input resistor network includes a resistor and input switching means connected in series, and the input switching means receives a control signal which renders the input switching means conductive or non-conductive, and each feedback resistor network includes a resistor and feedback switching means connected in series and the feedback switching means receives a control signal which renders the feedback switching means conductive or non-conductive.

3. A system as described in claim 2 in which the control signal means includes comparing means connected to the output of the amplifier and receiving a DC reference voltage corresponding to a predetermined amplitude for the output signal for providing a comparison signal corresponding to the comparison, clock means for providing clock pulses, and circuit means connected to the comparing means and to the clock means for providing the control signals in a manner so that the gain of the amplifier will be changed sequentially until an acceptable gain occurs.

4. A system as described in claim 3 in which the circuit means includes a bi-direction counter means having an up input and a down input for counting pulses applied to its up input in an up direction and counting pulses applied to its down input in a down direction and providing signals corresponding to the count in the counter means for providing a pulse when the comparison signal changes amplitude indicating that the output signal is unacceptable to the pulse means, switching means connected to the comparing means and to the clock means for providing the clock pulses to one of the counter means input when the amplitude of the comparison signal has not changed and providing the pulse from the pulse means to the other input when the amplitude of the comparison signal changes, and first decoder means connected to the counter means for providing the control signals and the digital gain signals in accordance with the signals from the counter means.

5. A system as described in claim 4 in which the control means further comprises divider means connected to the clock means and to the counter means for periodically resetting the counter means with a reset pulse.

6. A system as described in claim 5 further comprising multiplexing means adapted to receive a plurality of analog signals and connected to the first common connection of the plurality of the input resistor networks for providng received analog signals to the plurality of input resistor networks in accordance with a multiplexing signal, and means connected to the divider means and to the multiplexing means for providing the multiplexing signal to the multiplexing means in accordance with the pulses from the divider means.

* * * * *